United States Patent

[11] 3,593,185

[72] Inventor Carl W. Andersen
Sioux Falls, S. Dak.
[21] Appl. No. 817,081
[22] Filed Apr. 17, 1969
[45] Patented July 13, 1971
[73] Assignee Raven Industries, Inc.
Sioux Falls, S. Dak.

[54] TEMPERATURE-COMPENSATED UNIJUNCTION TRANSISTOR RELAXATION OSCILLATOR WITH SWITCHED REFERENCE VOLTAGE
12 Claims, 3 Drawing Figs.

[52] U.S. Cl. ........ 331/46, 331/111, 331/176
[51] Int. Cl. ........ H03k 3/26
[50] Field of Search ........ 331/111, 46, 55, 176, 109

[56] References Cited
UNITED STATES PATENTS
3,202,937 8/1965 Anderson ........ 331/111
3,259,854 7/1966 Marcus et al ........ 331/111

*Primary Examiner*—Roy Lake
*Assistant Examiner*—Siegfried H. Grimm
*Attorney*—Hill, Sherman, Meroni, Gross & Simpson

ABSTRACT: Temperature-compensated pulse-generating apparatus employs a complementary unijunction transistor as a threshold detector in a bridge-type comparator circuit for generating output pulses. A unijunction relaxation oscillator operatively controls an electronic switch which, in turn, controls the operation of the complementary unijunction transistor in a switching mode to effectively multiply the peak point current available to the complementary unijunction transistor. The cycle of the output pulses is determined by the delay of an RC timing circuit provided in the comparator circuit, the time constant of the timing circuit being controlled by selectively connecting therein of a timing resistance. The optional provision of the output pulses to shift registers provides easily programmed very long time delays wherein the total time thereof is controlled through a switch for selectively changing the value of the timing resistance.

PATENTED JUL 13 1971 3,593,185

INVENTOR.
CARL W. ANDERSEN

BY Hill, Sherman, Meroni, Gross & Simpson ATTORNEYS

TEMPERATURE-COMPENSATED UNIJUNCTION TRANSISTOR RELAXATION OSCILLATOR WITH SWITCHED REFERENCE VOLTAGE

BACKGROUND OF THE INVENTION

1. Field of the Invention

This invention relates to pulse-generating apparatus, and more particularly to temperature-compensated pulse generators in which the time delays controlling pulse recurrence are selectively established.

2. Description of the Prior Art

Relaxation oscillators are well recognized as apparatus for generating periodic pulses. Basically such oscillators may include an RC timing circuit wherein the times required for charging and discharging a timing capacitor determine the frequency of pulse generation and pulse duration. This art includes the utilization of an RC timing circuit as the input to a unijunction transistor which fires in response to the accumulation of a predetermined charge on the timing capacitor. Improvements in such circuits have led in one instance to the provision of a semiconductor diode to couple the RC timing circuit to the unijunction transistor for substantially lowering or completely blocking the emitter leakage current of the transistor. While this technique has improved the circuit with respect to the emitter leakage current, the provision of a semiconductor diode at this point of the circuit introduces a complication with respect to varying temperature conditions. For specific applications a circuit may be temperature compensated by unique design; however, it is more desirable and a primary object of the present invention to provide RC unijunction circuits which are more flexibly temperature compensated for operation at various temperature environments or under the conditions of a varying temperature environment.

Pulse generation can, of course, be controlled by varying the resistance and capacitance parameters of the timing circuit; however, in the present type of oscillator, variation of the timing resistance is limited by the peak point current of the transistor. It is therefore also desirable to provide means for permitting a much greater freedom of selection of the timing resistance.

SUMMARY OF THE INVENTION

According to the invention, the relaxation oscillator includes an RC timing circuit as the timing leg of a comparator circuit which includes a complementary unijunction transistor having one of its bases connected in a reference circuit which includes a semiconductor diode for temperature compensating the semiconductor diode which limits emitter leakage current. A second oscillator and a switching circuit operated thereby is connected to the complementary unijunction transistor to control the operation of the unijunction transistor in an on-off switching mode which clamps and releases the reference voltage in the reference leg of the comparator circuit at a much higher frequency than the frequency of the first oscillator. The last-mentioned action, in effect, multiplies the peak point current available to the unijunction transistor and allows it to fire with much greater values of timing resistance than would ordinarily permit operation, as the maximum value of the timing resistance is ordinarily limited by the value of the minimum emitter current of the unijunction transistor required to place it in an on condition.

BRIEF DESCRIPTION OF THE DRAWINGS

The foregoing and other objects, features and advantages of the invention, its organization, construction, and operation will be apparent from the following detailed description taken in conjunction with the accompanying drawings, in which.

DESCRIPTION OF THE PREFERRED EMBODIMENTS

Figure 1:
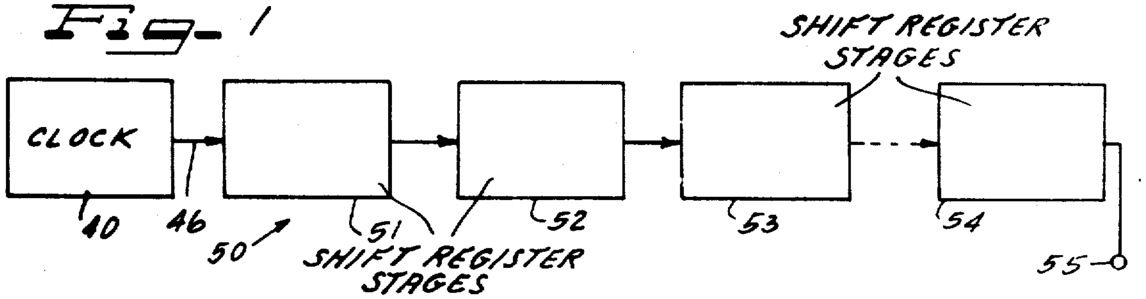
FIG. 1 is a block diagram representation of pulse-generating apparatus having a variable controlled delay time according to the present invention with optional shift registers.

In the drawings there is generally shown at 10 a circuit for generating pulses upon the application of a suitable DC potential at terminals 11 and 12. Connected across the input terminals is a bridge-type comparator circuit including serially connected elements capacitor 13 and resistance 14 which constitute the basic timing circuit for controlling the generation of output pulses. A semiconductor diode 15 connects the junction of capacitor 13 and resistor 14 to complementary unijunction transistor 16 at its emitter 19. Transistor 16 is connected to input terminal 11 by way of its one base 17 and resistor 20, and to input terminal 12 by way of its other base 18 and variable resistor 21 and semiconductor diode 22 in series.

The complementary unijunction transistor 16 operates as a threshold detector of the comparator circuit which senses a voltage on its emitter 19, the voltage at the junction of capacitor 13 and resistor 14 minus the voltage drop across diode 15, and compares this voltage to a reference voltage at the base 18 thereof. As the circuit operates and capacitor 13 is charging and discharging, the detected voltage varies up and down accordingly, and when this voltage reaches the firing-point voltage (normally referred to as $V_p$) and its peak point current (normally referred to as $I_p$) has been exceeded, transistor 16 will be conditioned to a conductive state.

The maximum value of timing resistance 14 that can normally be employed in circuits of the type just described, is determined and limited by the current required through emitter 19 of transistor 16 to render the transistor conductive. This current is generally in the order of a few microamperes (1 microampere in this particular illustration). Another consideration is the reverse leakage current through the transistor 16 which appears as a shunt across capacitor 13. This reverse leakage current sets a maximum value for the timing resistor 14. Diode 15 is employed to substantially reduce or block the reverse leakage current and permits an increase in the value for the timing resistance and accordingly smaller values for the timing capacitor for a given time delay; however, the provision of semiconductor diode 15 provides a temperature-voltage characteristic that must be compensated for applications at various temperature environments.

The adverse effects of diode 15 are obviated by the provision of circuit elements 21, 22 and 23. Diode 22 is provided in the reference leg of the comparator circuit to exhibit a temperature coefficient for compensating the temperature characteristic of diode 15 with a higher current flowing through diode 22 via resistors 21 and 23 to accommodate the difference between currents in the timing and reference legs of the circuit.

Resistor 21 provides a predetermined minimum impedance in the base 18 leg of transistor 16 and has the additional unique feature that in combination with a complementary unijunction transistor provides for trimming out of timing components errors. Resistor 21 is very effective as temperature compensation means for all other unijunction transistors; however, the complementary unijunction transistor permits wide variations in the value of resistor 21 without introducing temperature compensation complications into the relaxation oscillators.

As previously pointed out, the maximum value of timing resistance must be low enough to permit a minimum current into the emitter of transistor 16 to render the transistor conductive. This current is specified as the peak point current, and in the apparatus illustrated it is on the order of 1 microampere. Accordingly, the peak point current limits the value of timing resistor 14 to the order of a few megohms. Therefore, the present invention employs circuit means for effectively multiplying the peak point current to permit the utilization of much greater values of timing resistance The apparatus for permitting higher values of timing resistance includes circuit elements 24—35 which form a second relaxation oscillator and an electronic switch. Unijunction transistor 24 and its associated circuit elements 26—29 form a second relaxation oscillator connected across the input terminals 11 and 12. Capacitor 28 and resistor 29 form a timing circuit that is similar to the RC timing circuit of capacitor 13 and resistor 14 with the exception that the frequency of oscillation provided by capacitor 28 and resistor 29 is substantially higher than the frequency of the aforementioned oscillator. With the exception of the diodes 15 and 22, these two oscillators operate in substantially the same manner; therefore, the junction between capacitor 28 and resistor 29 experiences a varying potential which is coupled by capacitor 30 to base 33 of transistor 32. Transistor 32 switches on and off in response to this signal at the frequency of operation of the relaxation oscillator associated with transistor 24 and clamps and releases the reference voltage at this frequency between that established by conduction at base 18 and the potential applied to input terminal 12. This action, in effect, multiplies the peak point current $I_p$ available to the unijunction transistor 16 and permits the unijunction transistor to fire at much higher values of timing resistance. The switching of reference voltage at the base 18 increases the delta (difference) voltage between the emitter voltage and the reference voltage causing the increased effective value of peak point current. The permissible value of the timing resistance has been easily increased by a factor of 10 by employing the foregoing technique.

Figure 2:
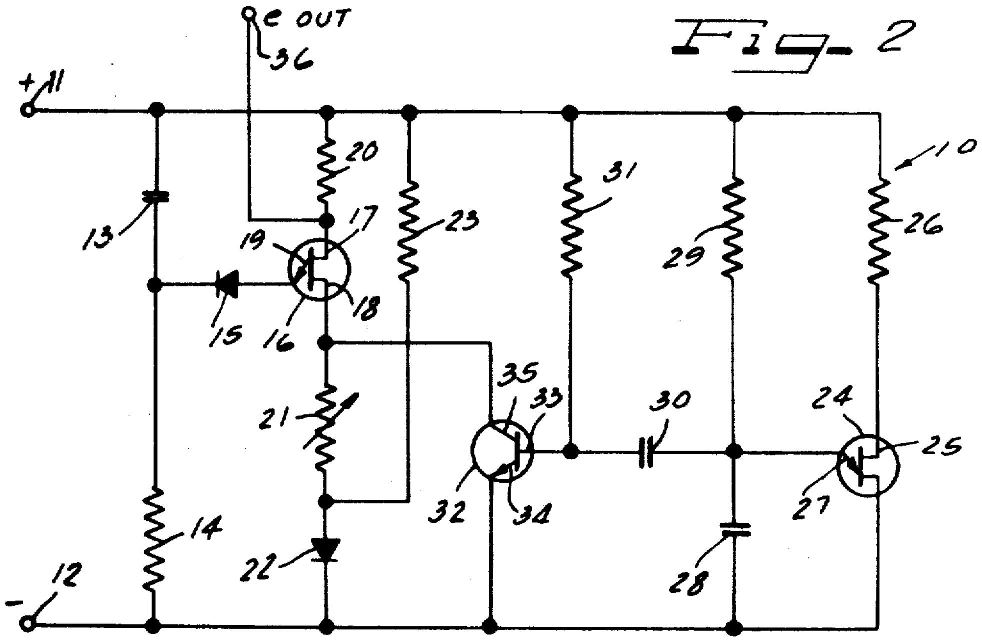
FIG. 2 is a schematic circuit diagram of pulse-generating apparatus according to the invention which may be employed as the clock in FIG. 1.
Figure 3:
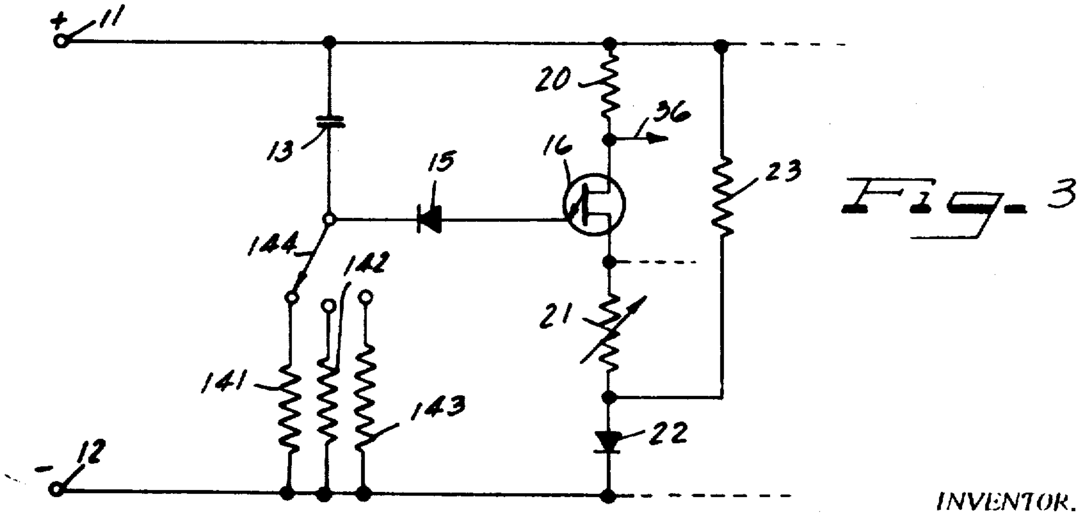
FIG. 3 is a schematic diagram of a modification of the circuit illustrated in FIG. 2 which may be advantageously employed as the clock of the apparatus of FIG. 1.

The circuit of FIG. 2 may be advantageously employed as the clock 40 in the apparatus of FIG. 1 wherein the output 46 corresponds to output terminal 36 of the complementary unijunction circuit. The provision of a shift register 50 including a predetermined number of stages 51—54 will provide an output pulse at output 55 which is delayed according to the number of shift register stages. This apparatus may be advantageously utilized to obviate the necessity of picking off various output points along the register and digitally decoding these outputs by employing a circuit such as illustrated in FIG. 3 wherein the timing resistor 14 of FIG. 2 has been supplanted by a plurality of resistors 141—143 of different value which are manually selectable by switch 144. The total time desired in this instance is programmed simply by selecting the suitable values of timing resistance as a very inexpensive and expedient programming technique as compared to digital decoding techniques.

A typical circuit in accordance with FIG. 2 employed the following components.

| Element: | Component |
|---|---|
| 16 | Threshold detector (complementary unijunction G.E. D5K). |
| 32 | Switching transistor—2N3904. |
| 24 | Unijunction transistor—2N2646. |
| 15 | Low-leakage blocking diode—G.E. SSD706. |
| 22 | Two signal diodes, each a 1N4148. |
| 20 | Resistor carbon—47 ohm. |
| 21 | Trimming resistor, metal-film, 1K-10K. |
| 23 | Resistor, carbon, 1K. |
| 31 | Resistor, carbon, 47K. |
| 29 | Resistor, carbon 330K. |
| 26 | Do. |
| 30 | Coupling capacitor, 0.1 mfd. |
| 28 | Timing capacitor, 0.1 mfd. |
| 14 | Timing resistor—metal film, 110K-100M. |
| 13 | Timing capacitor—4.0 mfd. |

The foregoing description has set forth pulse-generating apparatus wherein the output pulse at one base of a complementary unijunction transistor is recurring at a rate determined by the RC value of a timing circuit. The range of time constants available for determining the generation of pulses is much more flexible than that of prior art arrangements in that the maximum value of timing resistance has been substantially increased through the provision of a unique temperature-compensating circuit and a circuit which controls the complementary transistor in an on-off switching mode Further, a resistance which provides another aspect of temperature compensation is made variable to trim out frequency errors, i.e. time constant deviations.

Additionally, the apparatus is capable of extremely long time delays through the provision of a shift register or other suitable delay apparatus, the delays being easily programmed by switch selection of the timing resistance of the aforementioned timing circuit and such programming being very inexpensive compared to digital decoding techniques heretofore employed.

What we claim is:

1. Time base generating apparatus comprising:
a transistor including an emitter and first and second bases,
a timing circuit for connection to a source of power and including a capacitance and a resistance connected in series therewith,
a first semiconductor diode connected between said emitter and the junction between said capacitance and resistance,
means connected to said first base for deriving output signals,
means connected to said second base for delivering a switching voltage signal thereto, and means including a second semiconductor diode coupled to said second base for compensating the temperature coefficient of said first semiconductor diode.

2. The apparatus set forth in claim 1, wherein the last-mentioned means comprises means for constantly providing a current flow through said second semiconductor diode.

3. The apparatus set forth in claim 1, wherein said means for delivering said switching voltage signal comprises a relaxation oscillator.

4. The apparatus set forth in claim 3, wherein said relaxation oscillator comprises a unijunction transistor.

5. The apparatus set forth in claim 1, wherein said transistor is a complementary unijunction transistor.

6. The apparatus set forth in claim 1, wherein said timing circuit controls the operation of said transistor at a first frequency, and the frequency of said switching voltage is higher than said first frequency, and comprising delay means connected to said first base for deriving a second frequency from said first frequency.

7. The apparatus set forth in claim 6, wherein said delay means for deriving a second frequency comprises a frequency divider.

8. The apparatus set forth in claim 1, comprising switching means operatively connected between said means for delivering said switching voltage and said second base.

9. The apparatus set forth in claim 1, comprising a variable resistance connected between said second base and said semiconductor diode.

10. The apparatus set forth in claim 1, wherein said timing circuit comprises a plurality of resistances and manually operable switching means for selectively connecting said resistances in circuit with said capacitance.

11. The apparatus set forth in claim 1, comprising a frequency divider connected to said first base and operative to provide an output frequency less than the signal frequency at said first base, and said timing circuit comprises a plurality of resistances and means for selectively connecting said resistances in circuit to said capacitance to change the output frequency of said frequency divider.

12. Time base generating apparatus comprising:
an oscillator including transistor means having an emitter and at least one base, a timing circuit, a semiconductor device including a first diode connected between said emitter and said timing circuit to reduce reverse leakage current to said emitter;
means for applying a switching signal to said transistor means to operate said transistor means alternately conductive and nonconductive; and
temperature-compensating means including a second diode connected in circuit with said one base and means for constantly providing a current flow through said second diode to compensate the temperature coefficient of said semiconductor device.